(12) United States Patent
Kanda

(10) Patent No.: US 7,545,347 B2
(45) Date of Patent: Jun. 9, 2009

(54) ELECTRO-OPTICAL DEVICE AND ELECTRONIC APPARATUS

(75) Inventor: Eiji Kanda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 731 days.

(21) Appl. No.: 11/012,490

(22) Filed: Dec. 16, 2004

(65) Prior Publication Data

US 2005/0162353 A1 Jul. 28, 2005

(30) Foreign Application Priority Data

Jan. 22, 2004 (JP) ............................. 2004-014904

(51) Int. Cl.
*G09G 3/30* (2006.01)

(52) U.S. Cl. ...................................................... 345/76

(58) Field of Classification Search .............. 345/76–83
See application file for complete search history.

(56) References Cited

U.S. PATENT DOCUMENTS

| 6,351,077 B1 * | 2/2002 | Koyama .................. 315/169.3 |
| 6,724,149 B2 | 4/2004 | Komiya et al. |
| 6,847,343 B2 | 1/2005 | Anzai |
| 6,943,501 B2 * | 9/2005 | Kobayashi et al. ........ 315/169.3 |
| 2002/0011976 A1 * | 1/2002 | Hashimoto .................... 345/76 |
| 2003/0067458 A1 * | 4/2003 | Anzai ......................... 345/204 |

FOREIGN PATENT DOCUMENTS

| JP | A 11-251059 | 9/1999 |
| JP | A 2002-40961 | 2/2002 |
| JP | A 2002-108252 | 4/2002 |
| JP | A 2003-108032 | 4/2003 |
| JP | A 2004-226543 | 8/2004 |

* cited by examiner

*Primary Examiner*—Sumati Lefkowitz
*Assistant Examiner*—Robert E Carter, III
(74) *Attorney, Agent, or Firm*—Oliff & Berridge, PLC

(57) ABSTRACT

To improve the unevenness of brightness. A plurality of pixel circuits is arranged in a pixel region A. Main power lines LR, LG, and LB are provided in the outside of the pixel region A. In addition, first sub-power lines Lr1, Lg1, and Lb1 and second sub-power lines Lr2, Lg2, and Lb2 are provided in the inside of the pixel region A so as to be connected to each other at sub-power line connecting points P. Further, the pixel circuits are connected to the first sub-power lines Lr1, Lg1, and Lb1 at pixel connecting points Q. The structure in which these power lines are arranged in a mesh shape enables a considerable reduction in voltage drop and the improvement of brightness unevenness.

11 Claims, 18 Drawing Sheets

ELECTRO-OPTICAL DEVICE AND ELECTRONIC APPARATUS

BACKGROUND

The present invention relates to an electro-optical device comprising self-light emitting elements and an electronic apparatus using the same.

In recent years, apparatuses comprising organic light emitting diodes (hereinafter, referred to as 'OLED elements') have attracted public attention as image display devices substituting for liquid crystal display devices. The OLED element is a self-light emitting element of a current-driven type that spontaneously emits light, contrary to a liquid crystal element that changes the transmittance of light for display.

In an active matrix electro-optical device using the OLED elements, a pixel circuit is provided to control a grayscale level of light to be emitted from the OLED element. The setting of the grayscale level of emission light in each pixel circuit is performed by supplying a voltage value or a current value corresponding to the grayscale level of emission light to the pixel circuit to adjust a driving current flowing through the OLED element.

Since it is necessary that the driving current flow to drive the OLED element, a voltage drop occurs in power lines from a power supply circuit to pixel circuits. When a power supply voltage is lowered, a voltage to be applied to the OLED element is lowered, resulting in a reduction in brightness. Therefore, there has been a structure of power lines wiring shown in FIG. 17 to reduce the voltage drop caused by drawing power lines (for example, Patent Document 1). According to such a power line structure, a current i is supplied to pixel circuits in the vertical direction through wiring lines L arranged in a pixel region A.

[Patent Document 1] Japanese Unexamined Patent Application Publication No. 2002-108252

SUMMARY

Therefore, in order to improve an aperture ratio, it is necessary that the width of the wiring lines in the pixel region be smaller than that of the wiring lines outside the pixel region, so that most voltage drop occurs in the wiring lines inside the pixel region. In the conventional wiring structure, power line has a larger equivalent wiring resistance as approaching the center of the pixel region. Therefore, as shown in FIG. 17, the brightness at the center of the pixel region is lower than that at the upper or lower portion thereof.

Accordingly, the present invention is designed to solve the above-mentioned problems, and it is an object of the present invention to provide an electro-optical device capable of displaying an image with uniform brightness and an electronic apparatus using the electro-optical device.

In order to achieve the above object, the present invention provides an electro-optical device having a pixel region in which a plurality of pixel circuits each having a self-light emitting element is arranged. The electro-optical device comprises: main power lines provided along at least two sides of the pixel region in an outer circumferential portion of the pixel region; a plurality of first sub-power lines each connected to one side of each of the main power lines and extending to the inside of the pixel region; a plurality of second sub-power lines each connected to another side adjacent to the one side of each of the main power lines and extending to the inside of the pixel region; a plurality of sub-power line connecting points for connecting the first sub-power lines to the second sub-power lines at a portion of or all intersections therebetween; and pixel connecting points each provided in the pixel circuit to connect the pixel circuit to the first sub-power line and/or the second sub-power line.

According to the above-mentioned electro-optical device of the present invention, the first sub-power lines and the second sub-power lines are arranged in the pixel region, and these sub-power lines are connected to each other at the sub-power line connecting points. Therefore, it is possible to form the power lines in a mesh shape inside the pixel region. As a result, it is possible to reduce the resistance of power lines and thus to lower a power supply voltage, thereby greatly improving the unevenness of brightness. Here, for example, an organic light emitting diode or an inorganic light emitting diode can be used as the self-light emitting element. In addition, the main power lines may be provided along at least two sides of the pixel region. That is, it is not necessary to surround four sides of the pixel region, and the main power lines may be provided along two or three sides of the pixel region.

Here, preferably, the main power lines are provided so as to surround the pixel region, and both ends of each of the first sub-power lines and the second sub-power lines are connected to the main power lines. In this case, the resistance of the main power line is reduced, and the resistances of the first sub-power lines and the second sub-power lines are also reduced. Therefore, it is possible to lower a power supply voltage, thereby greatly improving the unevenness of brightness.

Further, the self-light emitting elements are composed of plural kinds of elements having different emission colors, and the main power lines are composed of a plurality of main power lines separately formed to correspond to the emission colors of the self-light emitting elements. In addition, preferably, the sub-power line connecting points are provided at a portion of or all the intersections of the first sub-power lines and the second sub-power lines that are connected to the main power line corresponding to the same emission color. In this case, it is possible to greatly improve the unevenness of color and brightness.

Furthermore, the self-light emitting elements are composed of plural kinds of elements having different emission colors, and the main power lines include a common main power line corresponding to some of the self-light emitting elements having different emission colors whose voltage values are in a predetermined range at the time of white display and a separate main power line corresponding to the others whose voltage values are outside the predetermined range. In addition, the sub-power line connecting points are provided at a portion of or all the intersections of the first sub-power lines and the second sub-power lines that are connected to the common main power line, and are also provided at a portion of all the intersections of the first sub-power lines and the second sub-power lines that are connected to the separate main power line. In this case, since the common power line is used, it is possible to decrease the number of main power lines. Here, light emission efficiency includes the efficiency of light emission brightness corresponding to the current to be supplied to the self-light emitting elements and the efficiency of light emission brightness corresponding to the voltage to be applied to the self-light emitting elements, and the commonization of the main power lines can be performed form the viewpoint of one of the efficiencies. Further, the predetermined range is preferably a range in which the difference in the light emission brightness generated by the commonization of the main power lines is visually permitted.

Moreover, it is preferable that the sub-power line connecting points be provided at a portion of the intersections of the first sub-power lines and the second sub-power lines such that the farther they are separated from the main power lines, the higher their density becomes. In addition, since the self-light emitting elements are arranged in the pixel region, it is necessary that the width of the first sub-power lines and the second sub-power lines be smaller than that of the main power lines. Therefore, the power impedance seen from each pixel circuit is greatly affected by the distance from the corresponding pixel circuit to the main power line. Thus, when the sub-power line connecting points are uniformly arranged, the power impedance of the pixel region at the center thereof is larger than that at the outer circumferential portion thereof. According to the present invention, the farther points are separated from the main power lines, that is, the closest they approach the center of the pixel region, the higher the density of the sub-power line connecting points becomes. Therefore, it is possible to obtain uniform brightness in the entire screen.

Further, the self-light emitting elements are composed of elements having the same emission color, and the sub-power line connecting points are provided at a portion of or all the intersections of the first sub-power lines and the second sub-power lines. In this case, it is possible to reduce power impedance and thus to greatly improve the unevenness of brightness. Further, preferably, the electro-optical device of the present invention further comprises color filters or a color-converting layer corresponding to a plurality of colors regularly arranged in the pixel region. In this case, in an electro-optical device for color display, it is possible to simplify the structure of power lines and to greatly improve the unevenness of brightness and color.

Furthermore, the pixel circuits are arranged in the pixel region in the row direction and the column direction. In addition, the first sub-power lines are formed parallel to the row direction, and each of the first sub-power lines is divided into a plurality of wiring lines. The divided wiring lines are connected to the second sub-power lines having the same color, respectively. In this case, since each of the first sub-power lines is divided, it is possible to improve an aperture ratio.

Moreover, the sub-power line connecting points are preferably arranged at the intersections of the first sub-power lines and the second sub-power lines for every emission color such that a total area of the sub-power line connecting points for each emission color corresponds to a current of each emission color at the time of white display. In this case, when the self-light emitting elements having different light emission efficiencies according to emission colors are used, it is possible that almost the same voltage drop occurs in each emission color, thereby greatly improving color unevenness. In addition, in each of the plurality of areas obtained by dividing the pixel region, the sub-power line connecting points are preferably arranged at the intersections of the first sub-power lines and the second sub-power lines for every emission color such that the total area of the sub-power line connecting points for each emission color corresponds to the current of each emission color at the time of white display. In this case, it is possible to improve color unevenness in the respective divided areas and thus to improve the color unevenness of the entire screen. Here, the total area of the sup-power line connecting points is the sum of the areas of the respective sub-power line connecting points. When the areas of the respective sub-power line connecting points in the same emission color are equal to each other, the total area of the sub-power line connecting points is the product of the area of a sub-power line connecting point and the number of sub-power line connecting points.

Further, the pixel circuits are arranged in the pixel region in the row direction and the column direction, and the first sub-power lines are formed parallel to the row direction for every predetermined number of rows. The larger the number of second sub-power lines is, the lower power impedance becomes, which results in a complicated structure and the reduction of an aperture ratio. However, according to the present invention, since the second sub-power lines are arranged for every predetermined number of rows, it is possible to improve an aperture ratio within the range in which a voltage drop does not matter and to simplify a wiring structure.

Furthermore, the pixel circuits are arranged in the pixel region in the row direction and the column direction, and a certain row of pixel circuits and the next row of pixel circuits deviate from each other by a predetermined distance in the row direction. In this case, it is possible to align the pixel circuits in a so-called delta arrangement.

Next, an electronic apparatus according to the present invention preferably comprises any one of the above-mentioned electro-optical devices. The electronic apparatus includes a personal computer, a mobile phone, a portable digital assistant, and the like.

DETAILED DESCRIPTION OF EMBODIMENTS

1. First Embodiment

Figure 1:
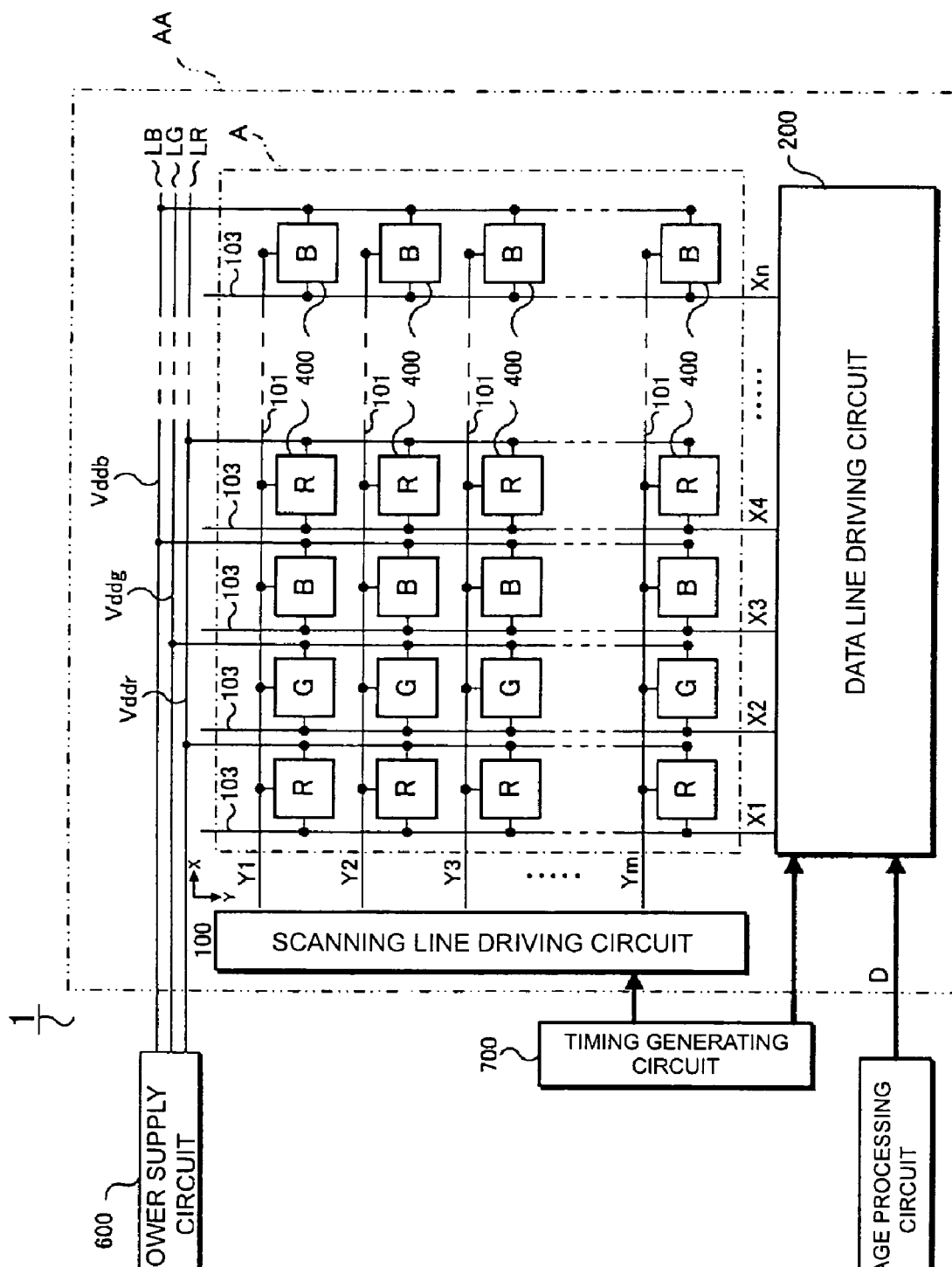
FIG. 1 is a block diagram showing a structure of an electro-optical device according to a first embodiment of the present invention.

FIG. 1 is a block diagram illustrating a schematic structure of an electro-optical device according to a first embodiment of the present invention. An electro-optical device 1 comprises an electro-optical panel AA and external circuits. The electro-optical panel AA has a pixel region A, a scanning line driving circuit 100, a data line driving circuit 200. In the pixel region A, m scanning lines 101 are formed parallel to the x direction. In addition, n data lines 103 are formed parallel to the y direction perpendicular to the x direction. Pixel circuits 400 are provided to correspond to the intersections of the scanning lines 101 and the data lines 103, respectively. Each pixel circuit 400 has an OLED element. In FIG. 1, reference characters "R", "G", and "B" respectively denote colors emitted from the OLED elements. In the present embodiment, the pixel circuits 400 having the respective colors are arranged along the data lines 103.

Further, among the respective pixel circuits 400, the pixel circuits 400 corresponding to R are connected to a main power line LR, the pixel circuits 400 corresponding to G are connected to a main power line LG, and the pixel circuits 400 corresponding to B are connected to a main power line LB. A power supply circuit 600 generates power supply voltages Vddr, Vddg, and Vddb. The power supply voltages are applied to the pixel units 400 corresponding to R, G, and B through the main power lines LR, LG, and LB, respectively. In the present embodiment, the main power lines LR, LG, and LB are arranged so as to surround the pixel region A, and are connected to the pixel circuits 400 in the pixel region by sub-power lines. The wiring of power lines will be described later in detail.

The scanning line driving circuit 100 generates scanning signals Y1, Y2, Y3, ..., Ym for sequentially selecting the plurality of scanning lines 101 and then supplies the signals to the respective pixel circuits 400. The scanning signal Y1 is a pulse having a width corresponding to one-time horizontal scanning period (1H) and is supplied to a first scanning line 101 from an initial timing of one-time vertical scanning period (1F). Subsequently, the pulse is sequentially shifted so as to be supplied to the second, third, ..., m-th scanning lines 101 as the scanning signals Y2, Y3, ..., Ym, respectively. In general, when a scanning signal Yi to be supplied to an i-th (where i is an integral number satisfying $1 \leq i \leq m$) scanning line 101 becomes a high-level, the scanning line 101 is selected.

The data line driving circuit 200 supplies supply grayscale signals X1, X2, X3, ..., Xn to the pixel circuits 400 arranged along the selected scanning line 101, respectively. In the present embodiment, the supply grayscale signals X1 to Xn are given to as voltage signals indicating grayscale brightness. A timing generating circuit 700 generates various control signals and then outputs the signals to the scanning line driving circuit 100 and the data line driving circuit 200. In addition, an image processing circuit 800 generates grayscale data D by an image processing such as gamma correction and then outputs the data to the data line driving circuit 200. Further, in the present embodiment, the power supply circuit 600, the timing generating circuit 700, and the image processing circuit 800 are provided in the outside of the electro-optical panel AA. However, a portion of or all these components may be integrated into the electro-optical panel AA. Furthermore, a portion of these components provided in the electro-optical panel AA may be provided as external circuits.

Figure 2:
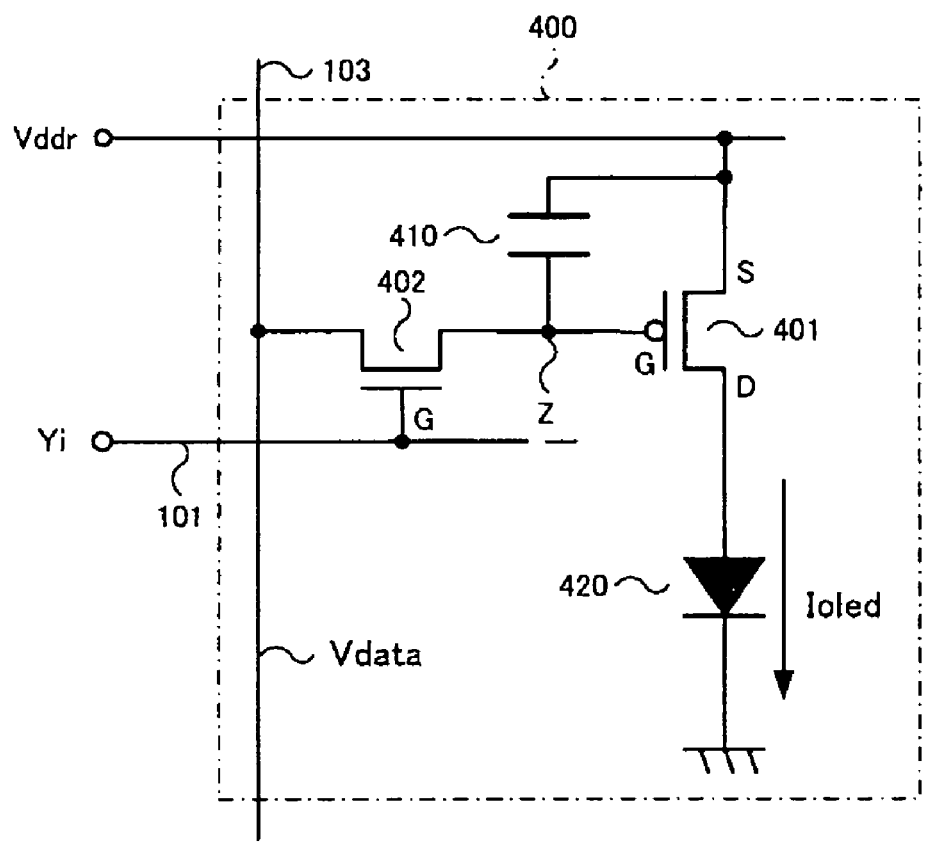
FIG. 2 is a circuit diagram showing a structure of a pixel circuit used in the electro-optical device.

Next, the pixel circuit 400 will be described. FIG. 2 is a circuit diagram of the pixel circuit 400. The pixel circuit 400 shown in FIG. 2 corresponds to R in the i-th row, and the power supply voltage Vddr is supplied thereto. The pixel circuits 400 corresponding to colors other than R have the same structure as the pixel circuit 400 corresponding to R does, except that the power supply voltage Vddg (green) or the power supply voltage Vddb (blue) are supplied thereto instead of the power supply voltage Vddr. The pixel circuit 400 comprises two thin film transistors (hereinafter, referred to as "TFTs") 401 and 402, a capacitor element 410, and an OLED element 420. A source electrode of the p-channel type TFT 401 is connected to the main power line LR, and a drain electrode thereof is connected to an anode of the OLED element 420. In addition, the capacitor element 410 is provided between a gate electrode and the source electrode of the TFT 401. The gate electrode of the TFT 402 is connected to the scanning line 101, the source electrode thereof is connected to the data line 103, and the drain electrode thereof is connected to the gate electrode of the TFT 401.

In such a structure, when the scanning signal Yi becomes a high-level, an n-channel TFT 402 is turned on. Therefore, the voltage of a connecting point Z is equal to a voltage Vdata. At this time, electric charge corresponding to the voltage Vddr minus the voltage Vdata (Vddr−Vdata) is accumulated in the capacitor element 410. Then, when the scanning signal Yi becomes a low-level, the TFT 402 is turned off. Since the input impedance of the gate electrode of the TFT 401 is extremely high, an accumulated state of the electric charge in the capacitor element 410 does not vary. The voltage between the gate and the source of the TFT 401 is maintained in the voltage (Vddr-Vdata) when the voltage Vdata is applied. Since a current Ioled flowing through the OLED element 420 is determined by the voltage between the gate and the source of the TFT 401, the current Ioled corresponding to the voltage Vdata flows therethrough.

The magnitude of the current Ioled is determined by the voltage (Vddr-Vdata) between the gate and the source of the TFT 401. Therefore, it is important to maintain the power supply voltage Vddr to be uniform in the inside of the pixel region A in order to display an image with uniform brightness. Thus, the present embodiment adopts a wiring structure capable of reducing a voltage drop due to the power supply lines.

Figure 3:
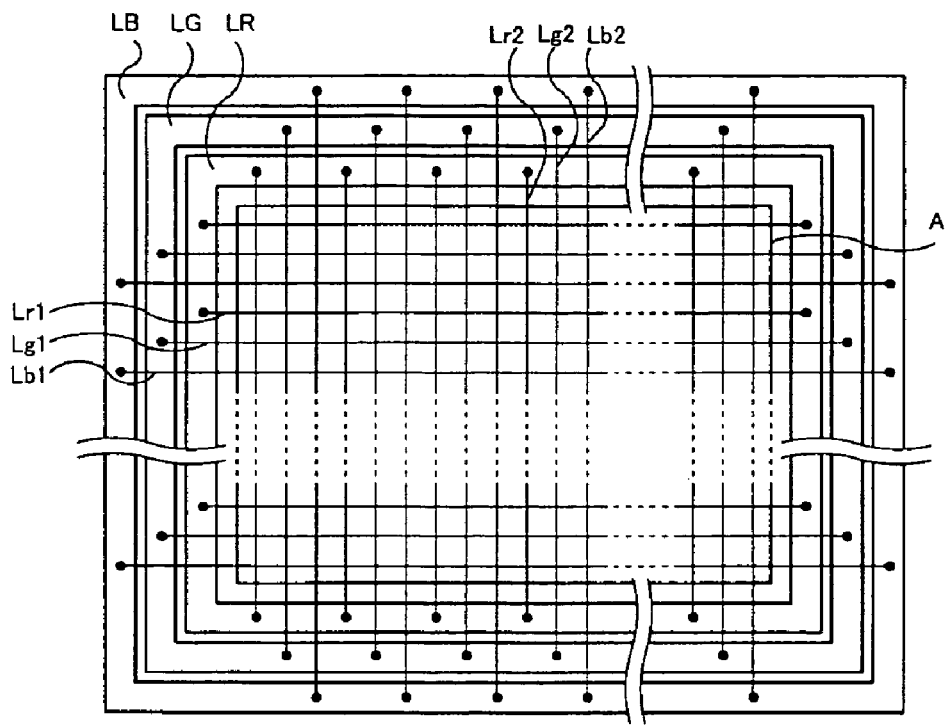
FIG. 3 is a view showing a schematic structure of power line wiring in the electro-optical device.

FIG. 3 shows a schematic structure of power line wiring. The power lines include the main power lines LR, LG, and LB arranged to surround the pixel region A, first sub-power lines Lr1, Lg1, and Lb1, and second sub-power lines Lr2, Lg2, and Lb2. The main power lines LR, LG, and LB are provided to correspond to the respective colors emitted from the OLED elements 420. The reason that the main power lines are provided for every emission color is as follows. First, since the OLED elements 420 have different light emission efficiencies with respect to the respective emission colors, it is preferable that the widths of the main power lines LR, LG, and LB be set according to the light emission efficiency. That is, since a voltage drop depends on the amount of current, the line width is set according to the light emission efficiency to uniform the voltage drop. Second, since the OLED elements 420 have different light emission efficiencies with respect to the respective emission colors, it is necessary to supply different power supply voltages.

Next, one end of each of the first sub-power lines Lr1, Lg1, and Lb1 is connected to a first side of each of the main power lines LR, LG, and LB to extend to the inside of the pixel region A, and the other end thereof is connected to a second side opposite to the first side. The first sub-power lines Lr1, Lg1 and Lb1 are wiring lines arranged parallel to the row direction. Meanwhile, one end of each of the second sub-power lines Lr2, Lg2, and Lb2 is connected to a third side of each of the main power lines LR, LG, and LB adjacent to the first side thereof to extend to the inside of the pixel region A, and the other end thereof is connected to the other side opposite to the third side. The second sub-power lines Lr2, Lg2, and Lb2 are wiring lines arranged parallel to the column direction. The first sub-power lines Lr1, Lg1, and Lb1 and the second sub-power lines Lr2, Lg2, and Lb2 are provided to correspond to the types of the main power lines LR, LG, and LB, respectively. As a result, the power lines are formed in a mesh shape in the pixel region A.

Figure 4:
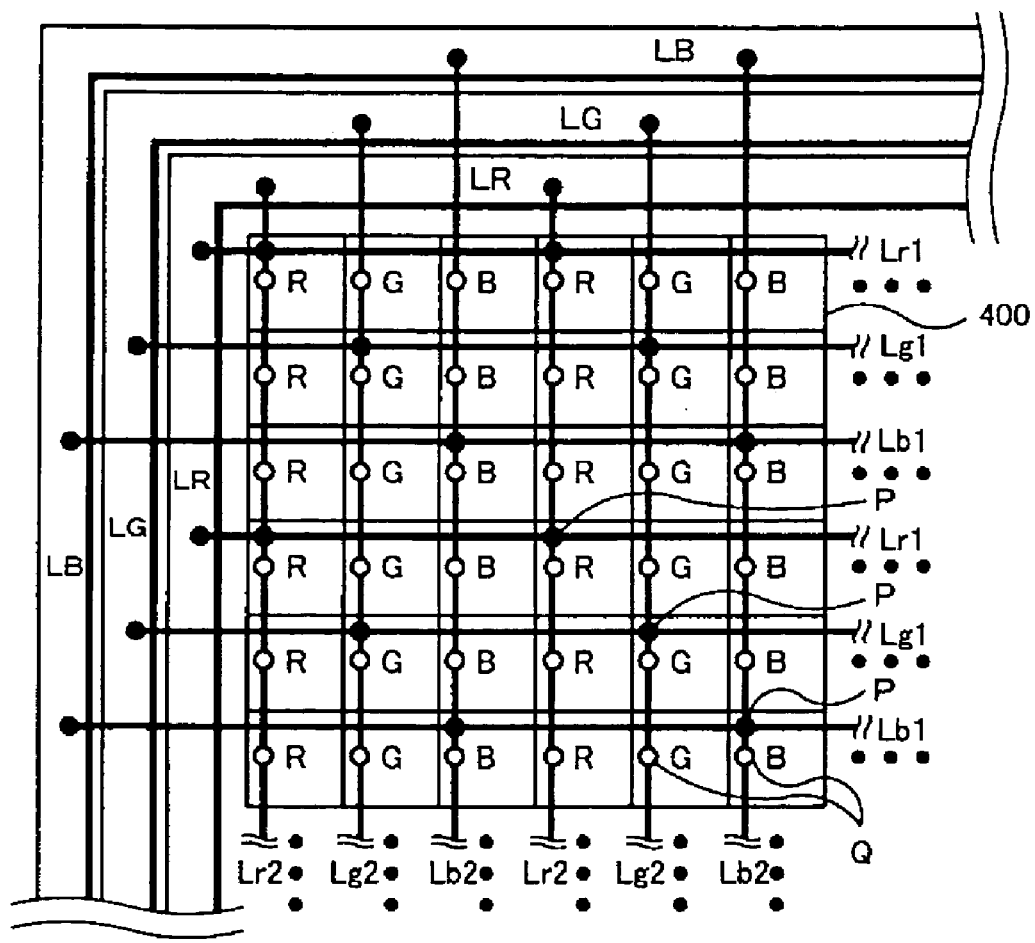
FIG. 4 is a view showing a detailed structure of the power line wiring in the electro-optical device.

FIG. 4 shows a detailed structure of power line wiring. The first sub-power lines Lr1, Lg1, and Lb1 intersect with the second sub-power lines Lr2, Lg2, and Lb2 in the pixel region such that the first sub-power line and the second sub-power line that are connected to the same power line intersect each other at a sub-power line connecting point P. More specifically, the first sub-power lines Lr1 are connected to the second sub-power lines Lr2, the first sub-power lines Lg1 are connected to the second sub-power lines Lg2, and the first sub-power lines Lb1 are connected to the second sub-power lines Lb2. In addition, in the present embodiment, the respective pixel circuits 400 and the second sub-power lines Lr2, Lg2, and Lb2 are connected to each other at pixel connecting points Q (white circles in FIG. 4). Further, the pixel connecting points Q may be provided at the first sub-power lines Lr1, Lg1, and Lb1 and/or the second sub-power lines Lr2, Lg2, and Lb2.

Therefore, it is possible to greatly reduce the resistance of the wiring lines by providing the power lines in a mesh shape inside the pixel region A. As a result, it is possible to supply uniform power voltages Vddr, Vddg, and Vddb to the respective pixel circuits 400 and thus to greatly improve brightness unevenness and color unevenness.

2. Second Embodiment

Next, an electro-optical device 1 according to a second embodiment will be described. The electro-optical device 1 of the second embodiment has the same structure as that of the first embodiment except that the same power supply voltage is applied to pixel circuits for R and B by using power lines in common. In the electro-optical device 1 of the first embodiment, it is assumed that the OLED elements 420 have different light emission efficiencies with respect to the respective emission colors. However, it is possible to obtain almost the same light emission efficiency from the OLED elements having different emission colors according to the kind of organic EL material used for a light-emitting layer. The electro-optical device 1 of the second embodiment uses the OLED elements 420 having substantially the same light emission efficiency for R and B. In a combination of colors, the OLED elements having similar voltage values at the time of white display are combined to each other. For example, when voltages for R and B required for obtaining the brightness necessary for the white display are Vr and Vb, respectively, the difference in voltage between Vr and Vb must not exceed −2V for visual permission. The light emission efficiency of the OLED element 420 can be understood from the relationship between a driving current flowing through the OLED element 420 and the brightness of emission light and the relationship between a voltage applied to the OLED element 420 and the brightness of emission light.

Figure 5:
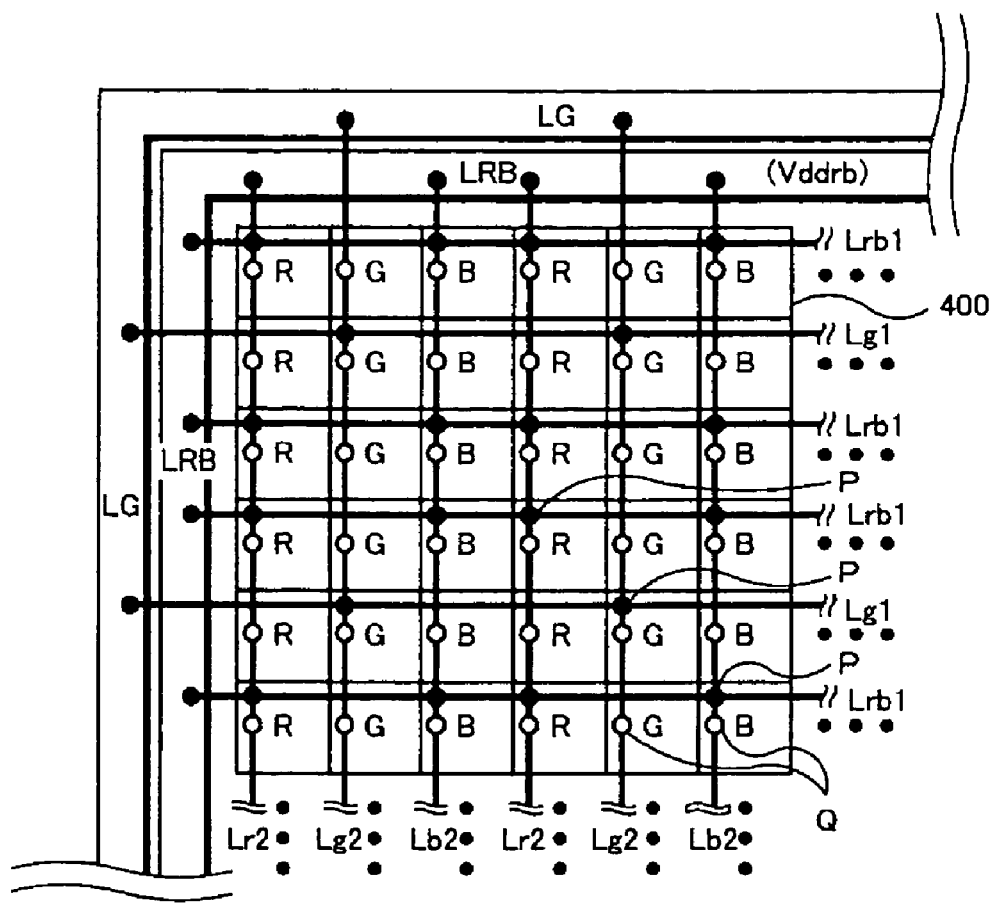
FIG. 5 is a view showing a detailed structure of power line wiring in an electro-optical device according to a second embodiment of the present invention.

FIG. 5 shows a detail structure of the power line wiring. First, the main power lines include a common main power line LRB common to R and B and a main power line LG (hereinafter, referred to as a separate main power line) corresponding to G. A power supply voltage Vddrb common to R and B is supplied from the power supply circuit 600 (not shown) to the common main power line LRB. The commonization of the main power lines is preferably performed on the OLED elements whose light emission efficiencies are within a predetermined range, and more preferably within the range in which a difference in the brightness of emission light caused by the commonization of the main power lines is visually permitted. In other words, voltage values for the respective emission colors required for obtaining the brightness necessary for white display are equal to each other. For example, the difference between the voltage values must not exceed 10% for visual permission.

Further, when the width of the separate power line LG is W1, the width of the common power line LRB is W2, a current flowing through the OLED element for G in the same brightness is I1, a current flowing through the OLED element for R is I2r, and a current flowing through the OLED element for B is I2b, a ratio of W1 and W2 is expressed by the following Expression:

$$W1/W2=I1/(I2r+I2b).$$

The setting of line widths described above makes voltage drop amounts with respect to the respective emission colors equal to each other, thereby improving color unevenness.

Further, in the present embodiment, the first sub-power lines Lrb1 and Lg1 are used. The first sub-power line Lrb1 intersects with the second sub-power lines Lr2 and Lb2 at the sub-power line connecting points P. In the second embodiment, similar to the first embodiment, three types of second sub-power lines corresponding to R, G, and B can be used. However, in the present embodiment, the first sub-power lines Lrb1 are adopted to more reduce power impedance.

As such, the commonization of the main power lines enables a simple wiring structure and an increase in the number of sub-power line connecting points P, thereby supplying a uniform power supply voltage. As a result, it is possible to greatly improve brightness unevenness.

3. Third Embodiment

Figure 6:
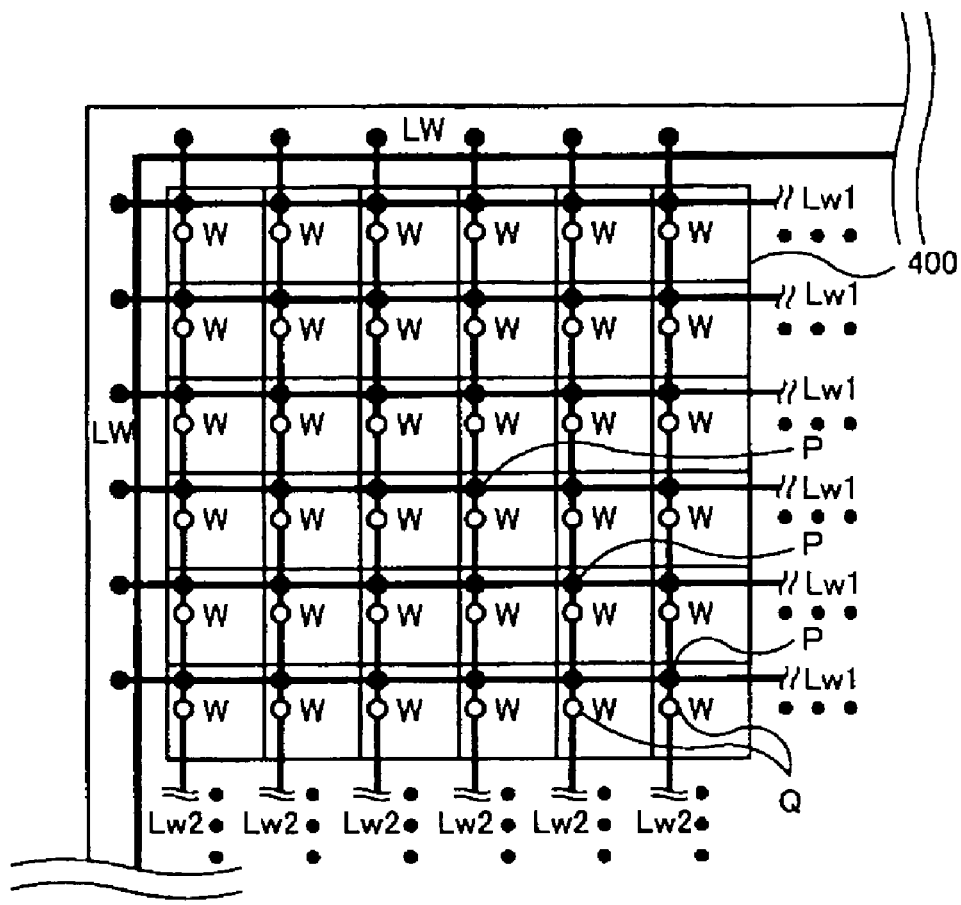
FIG. 6 is a view showing a detailed structure of power line wiring in an electro-optical device according to a third embodiment of the present invention.

Next, an electro-optical device 1 according to a third embodiment will be described. The electro-optical device 1 of the third embodiment has the same structure as that of the first embodiment except that monochromatic OLED elements are used. FIG. 6 shows a detailed structure of power line wiring. In this case, one kind of power line is used, that is, only a main power line LW is used as shown in FIG. 6. In addition, the sub-power line connecting points P are provided at all positions where the first sub-power lines Lw1 intersect with the second sub-power lines Lw2. That is, the first sub-power lines Lw1 and the second sub-power lines Lw2 are arranged in a lattice shape so as to be connected to each other at the intersections therebetween, which results in a considerable reduction in power impedance. Therefore, it is possible to supply a uniform power supply voltage to the respective pixel circuits 400.

Further, the power impedance seen from each pixel circuit 400 is determined according to the distance from the corresponding pixel circuit 400 to the main power line LW. Therefore, the power impedance seen from the pixel circuit 400 located at the center of the pixel region A is larger than that seen from the pixel circuit 400 located at the outer circumferential of the pixel region A. Thus, the sub-power line connecting points P may be provided such that their density gradually increases toward the center of the pixel region A to make the power impedance seen from the respective pixel circuits 400 equal to each other. In this case, the power impedance is high, compared to the case in which the sub-power line connecting points P are arranged at all the intersections, but a uniform voltage drop can be obtained. Therefore, it is possible to more reduce brightness unevenness.

Figure 7:
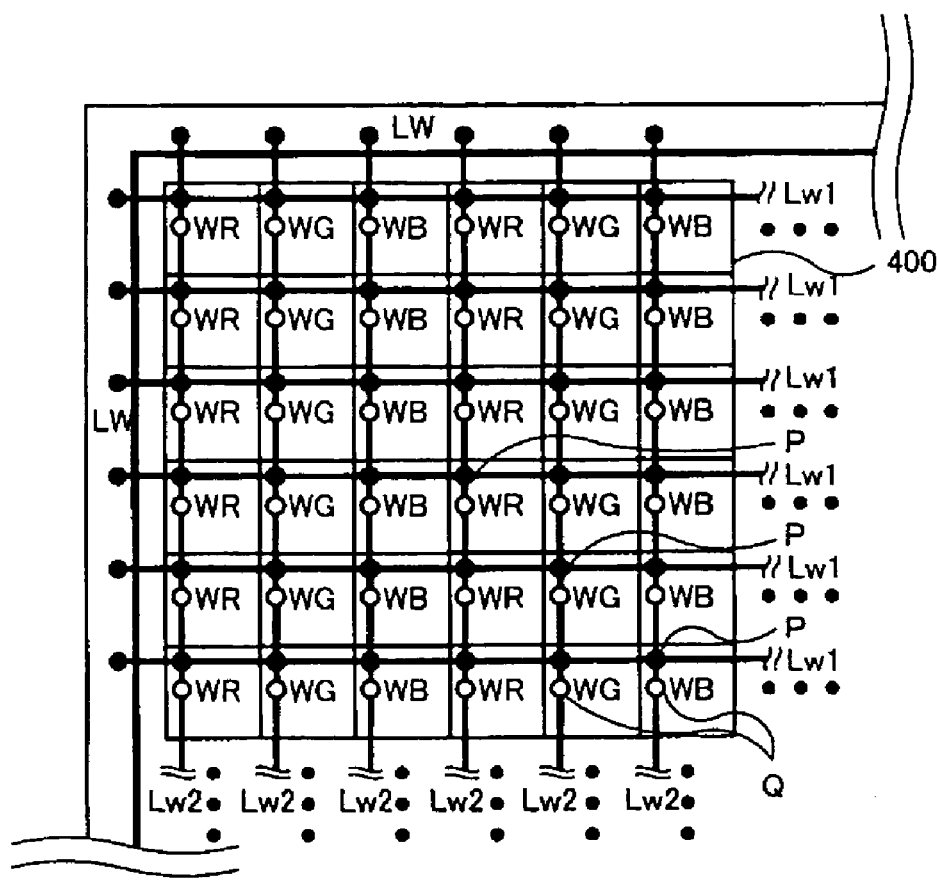
FIG. 7 is a view showing a detailed structure of power line wiring in an electro-optical device according to a modification of the third embodiment.

Furthermore, a combination of color filters and the monochromatic OLED elements can be used for color display. FIG. 7 shows a detailed structure of power line wiring when the color filters and the monochromatic OLED elements are combined to each other. In FIG. 7, "WR" indicates a pixel provided with an R color filter, "WG" indicates a pixel provided with a G color filter, and "WB" indicates a pixel provided with a B color filter. In this case, it is possible to remove brightness unevenness in color display. The above-mentioned electro-optical device 1 of the first embodiment uses the OLED elements 420 having different emission colors to perform color display. Therefore, three types of main power lines LR, LG, and LB are provided, accordingly three types of first sub-power lines and three types of second sub-power lines are provided. In particular, since the first sub-power lines intersect with the second sub-power lines in the pixel region A, it is necessary to form these sub-power lines in a laminated structure in which an insulting layer is interposed therebetween. On the other side, when the color filters and the monochromatic OLED elements are combined to each other, the first sub-power lines Lw1, the second sub-power lines Lw2, and the sub-power line connecting points P can be formed at the same time, thereby considerably reduce the number of manufacturing processes. Further, instead of the color filters, a color converting layer capable of converting colors can be provided.

4. Fourth Embodiment

Figure 8:
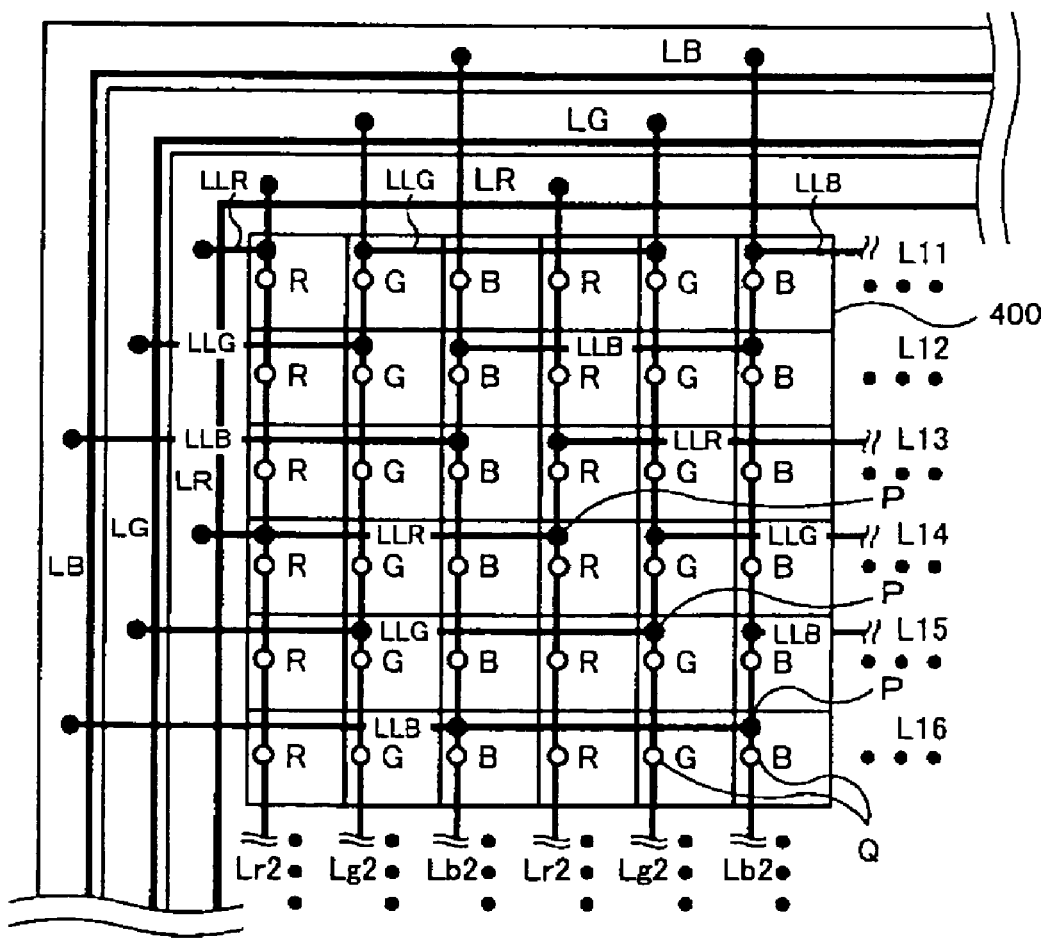
FIG. 8 is a view showing a detailed structure of power line wiring in an electro-optical device according to a fourth embodiment of the present invention.

Next, an electro-optical device 1 according to a fourth embodiment will be described. The electro-optical device 1 of the fourth embodiment has the same structure as that of the first embodiment except for a detailed wiring structure of the first sub-power lines Lr1, Lg1, and Lb1. FIG. 8 shows a detailed structure of power line wiring. As shown in FIG. 8, first sub-power lines L11, L12, and L13, . . . , L1n formed in the row direction are discontinuously provided, respectively. For example, the first sub-power line L11, which is the first row, is connected to the main power line LR and the second sub-power line Lr2 which is the first column and is not connected between an R pixel and a G pixel. The first sub-power line L11 connects the second sub-power line Lg2 which is the second column to the second sub-power line Lg2 which is the fifth column and is not connected between the G pixel and a B pixel. In addition, the first sub-power line L11 in the first row is not connected between the B pixel and the R pixel (not shown), and this pattern is repeated to the following first sub-power lines in this way.

That is, the first sub-power line L11 comprises a wiring line LLR for R connecting the main power line LR for R to the second sub-power line Lr2 (the first column), a wiring line LLG for G connecting the second sub-power line Lg2 for G adjacent to the second sub-power line Lr2 (the first column) to the next second sub-power line Lg2, and a wiring line LLB for B connecting the second sub-power line Lb2 for B adjacent to the second sub-power line Lg2 to the next second sub-power line Lb2. In this way, the pattern of the wiring line LLR for R→(division)→the wiring line LLG for G→(division)→the wiring line LLB for B→(division)→the wiring line LLR for R is repeated. The same pattern as described above is applied to other first sub-power lines L12, L13, . . . . In other words, the first sub-power lines are formed parallel to the row direction. In addition, each of the first sub-power lines is divided into a plurality of wiring lines, and the divided wiring lines respectively connect the second sub-power lines corresponding to the same color to each other.

Since the first sub-power lines L11, L12, L13, . . . , L1n are discontinuously formed in this way, the area of the pixel circuit 400 in which the first sub-power line is not formed in the row direction can be allocated to the area of the OLED element 420. Therefore, it is possible to improve an aperture ratio.

5. Fifth Embodiment

Next, an electro-optical device 1 according to a fifth embodiment will be described. The electro-optical device 1 of the fifth embodiment has the same structure as that of the first embodiment except for the arrangement of the sub-power line connecting points P. In the present embodiment, the light emission efficiency of the OLED element 420 for G is twice the light emission efficiency of the OLED element for B or R.

Figure 9:
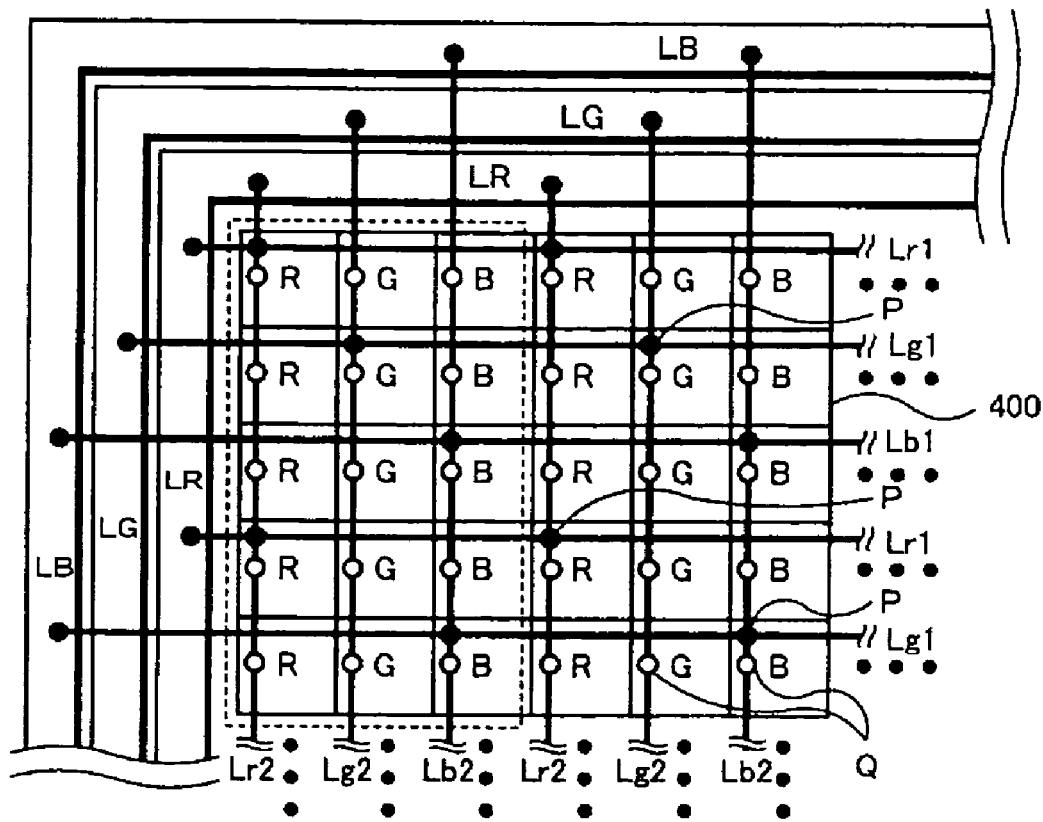
FIG. 9 is a view showing a detailed structure of power line wiring in an electro-optical device according to a fifth embodiment of the present invention.

FIG. 9 shows a detailed structure of power line wiring. Here, a ratio of the sub-power line connecting points P on the second sub-power lines Lr2, Lg2, and Lb 2 is set according to the light emission efficiency of the OLED element. In FIG. 9, an area surrounded by a dotted line shows a basic arrangement pattern of the sub-power line connecting points P, and the sub-power line connecting points P are similarly arranged in other areas with this arrangement pattern. First, in the area surrounded by the dotted line, one sub-power line connecting point P is arranged on the second sub-power line Lg2. In addition, two sub-power line connecting points P are arranged on the second sub-power lines Lr2 and Lb2, respectively. As the number of sub-power line connecting points P increases, power impedance is reduced. In the present embodiment, a ratio of the number of G sub-power line connecting points P to the number of R sub-power line connecting points P is 1:2, which is in inverse proportion to light emission efficiency. Since the light emission efficiency of the G pixel is twice as large as that of the R pixel, the amount of current is decreased by a half in the same brightness. Therefore, it is possible to remove a variation in the voltage drop between emission colors.

In other words, the sub-power line connecting points P in a predetermined area of the pixel region A are arranged such that wiring resistance values are equal to each other corresponding to light emission efficiency. Further, the arrangement pattern in the predetermined area is repeatedly provided in other areas. According to such a wiring structure, it is possible to greatly improve color unevenness.

In the present embodiment, the sub-power line connecting points P are preferably arranged for every emission color such that the total area of the sub-power line connecting points P with respect to the respective emission colors corresponds to the current of each emission color at the time of white display. In this case, it is possible to improve color unevenness in the divided areas and thus to improve the color unevenness of the entire screen. Here, the total area of the sub-power line connecting points P is the sum of the areas of the respective sub-power line connecting points P. When the areas of the respective sub-power line connecting points P are equal to each other in the same emission color, the total area of the sub-power line connecting points P is the product of the areas of the respective sub-power line connecting points P and the number of sub-power line connecting points P.

6. Sixth Embodiment

Figure 10:
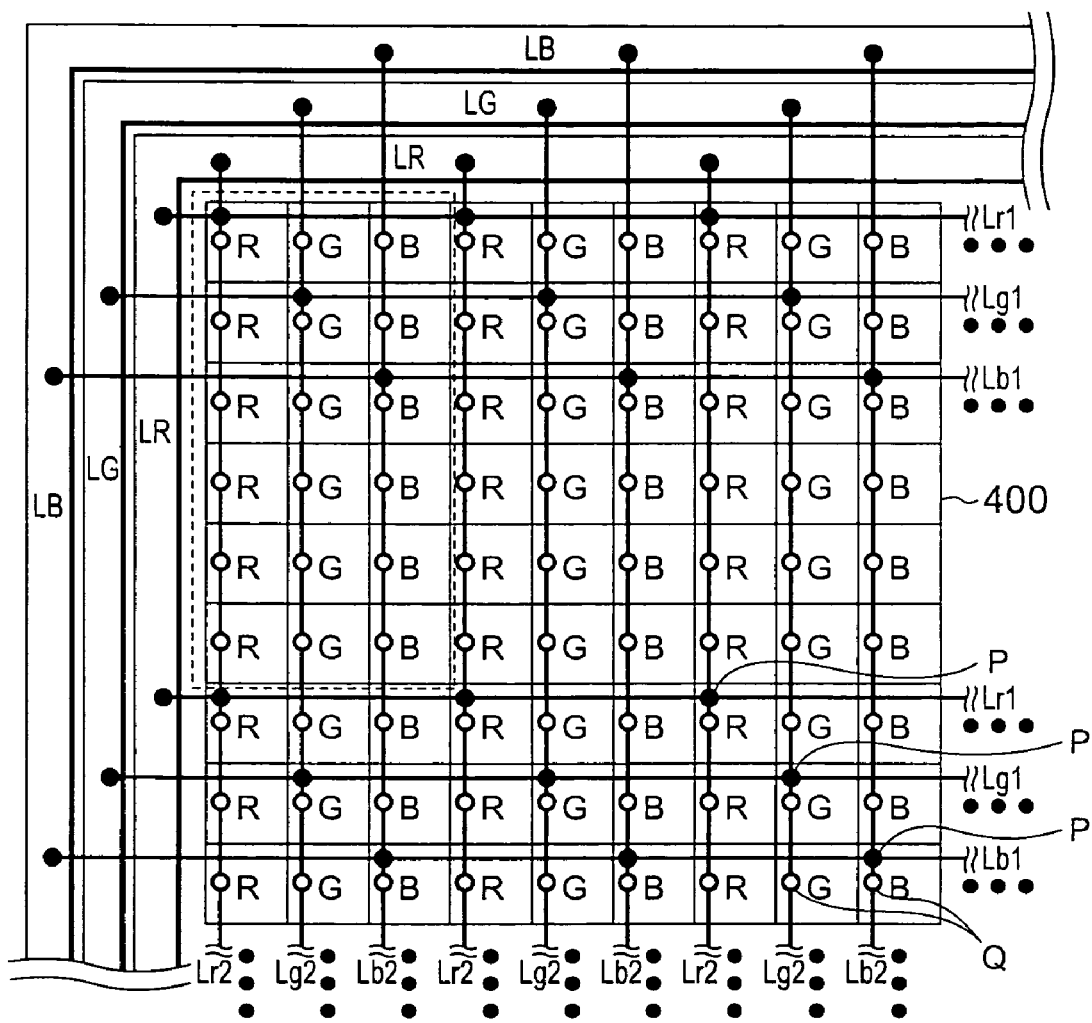
FIG. 10 is a view showing a detailed structure of power line wiring in an electro-optical device according to a sixth embodiment of the present invention.

Next, an electro-optical device 1 according to a sixth embodiment will be described. The electro-optical device 1 of the sixth embodiment has the same structure as that of the first embodiment except for the arrangement of the sub-power line connecting points P. FIG. 10 shows a detailed structure of power line wiring. In the present embodiment, the second sub-power lines Lr2, Lg2, and Lb2 are not provided in the third to fifth rows in the pixel region A. That is, the second sub-power lines Lr2, Lg2, and Lb2 are not entirely provided in the pixel region A, but are provided for every n (three in the present embodiment) pixel circuits 400. From the viewpoint of reducing power impedance, it is preferable that the number of second sub-power lines Lr2, Lg2, and Lb2 be large. However, in the range in which a voltage drop does not matter, the second sup-power lines Lr2, Lg2, and Lb2 may be thinned out.

When the second sub-power lines Lr2, Lg2, and Lb2 are concentratively thinned out at a specified area (for example, the center in the vertical direction), the power impedance in the specified area increases, so that brightness unevenness may be generated. Therefore, it is preferable to uniformly thin out the second sub-power lines Lr2, Lg2, and Lb2 over the entire pixel region A. That is, it is preferable to form a wiring structure in which the area surrounded by the dotted line is set to a basic pattern and the basic pattern is repeated.

According to the present embodiment, the second sub-power lines Lr2, Lg2, and Lb2 can be thinned out within the range in which the voltage drop does not matter. Therefore, it is possible to improve an aperture ratio and to achieve a simple wiring structure.

7. Modifications (1) In the first to sixth embodiments described above, each of the R, G, and B pixel circuits 400 is arranged in line along the column direction. However, the present invention is not limited thereto, but a wiring structure in which the R, G, and B pixel circuits 400 are aligned in a delta arrangement can be applied to the first to sixth embodiments, respectively.

Figure 11:
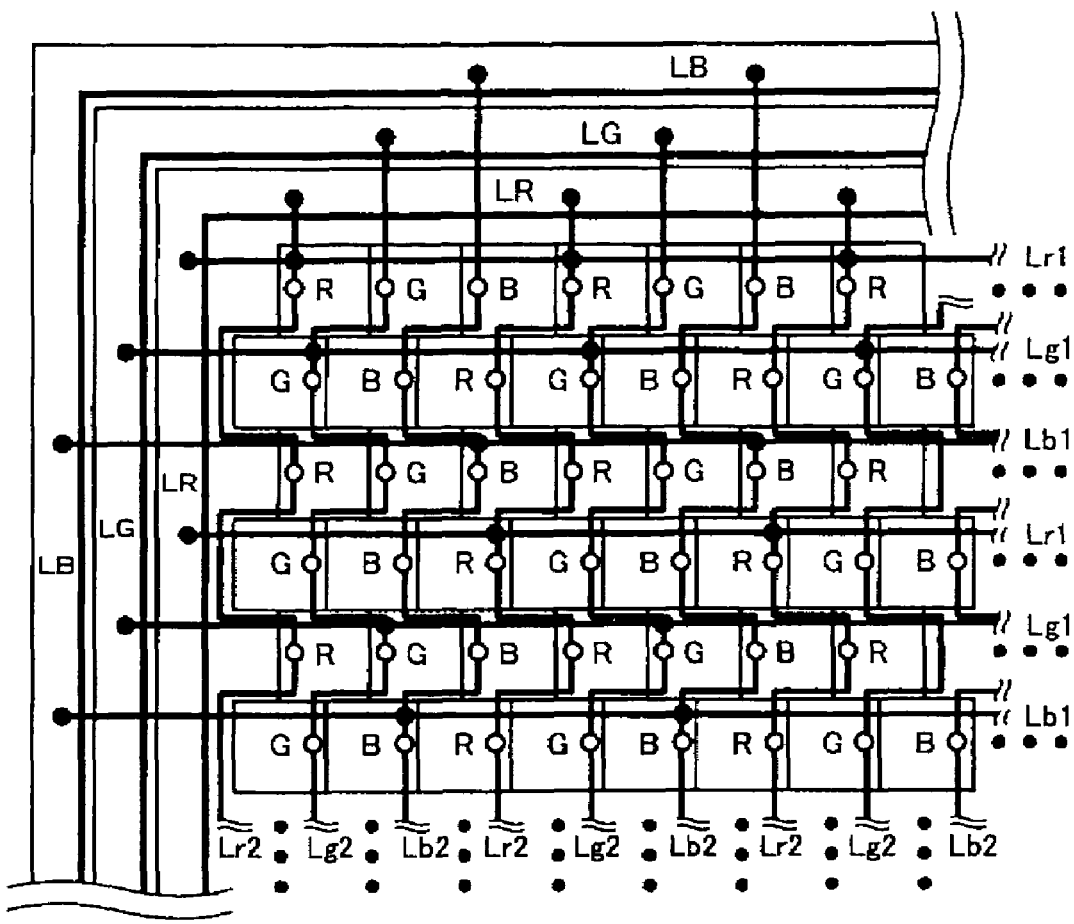
FIG. 11 is a view showing a detailed structure of power line wiring in an electro-optical device according to a modification of the present invention.

FIG. 11 shows an example in which the wiring structure of the first embodiment is applied to the pixel circuits having a delta arrangement. As shown in FIG. 11, the pixel circuits 400 having the delta arrangement are arranged such that a certain row of pixel circuits deviates from the next row of pixel circuits by a half pitch in the row direction. In addition, the structure shown in FIG. 11 is the same as that of the first embodiment except that the second sub-power lines Lr2, Lg2, and Lb2 are arranged so as to thread through the pixel circuits 400 having the same color in a non-straight line in the vertical direction. Therefore, it is possible to considerably reduce the resistance of wiring lines. As a result, it is possible to uniformly supply the power supply voltage Vddr, Vddg, and Vddb to the respective pixel circuits 400 and thus to greatly improve brightness unevenness.

Figure 12:
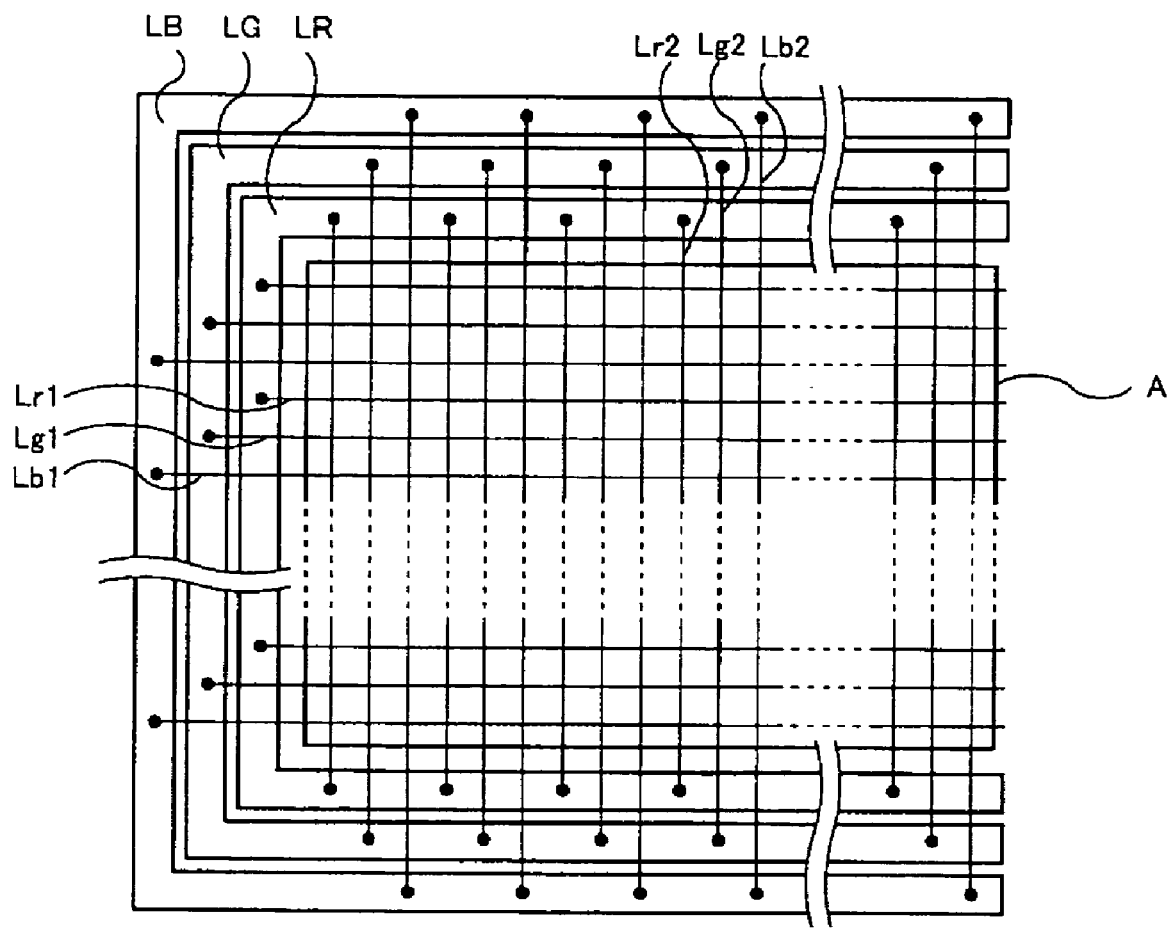
FIG. 12 is a view showing a structure of main power lines in the electro-optical device according to the modification of the present invention.
Figure 13:
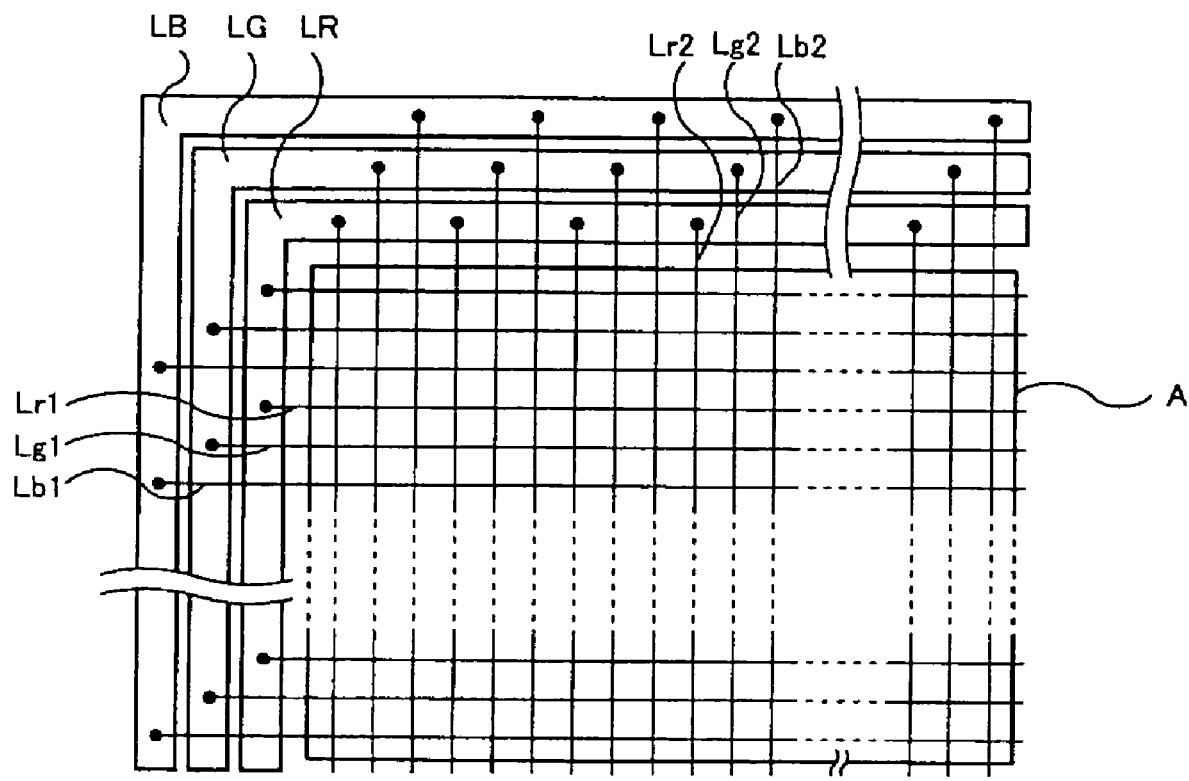
FIG. 13 is a view showing another structure of the main power lines in the electro-optical device according to the modification of the present invention.

(2) In the above-mentioned first to sixth embodiments and modification, the main power lines LR, LB, and LG are formed so as to surround the pixel region A, but the present invention is not limited thereto. For example, as shown in FIG. 12, the main power lines LR, LB, and LG may be formed along three sides of the pixel region A. Alternatively, as shown in FIG. 13, the main power lines LR, LB, and LG may be formed along two sides of the pixel region A. In these cases, it is possible to form the first sub-power lines Lr1, Lg1, and Lb1 and the second sub-power lines Lr2, Lg2, and Lb2 in a mesh shape inside the pixel region A.

8. Electronic Apparatus

Figure 14:
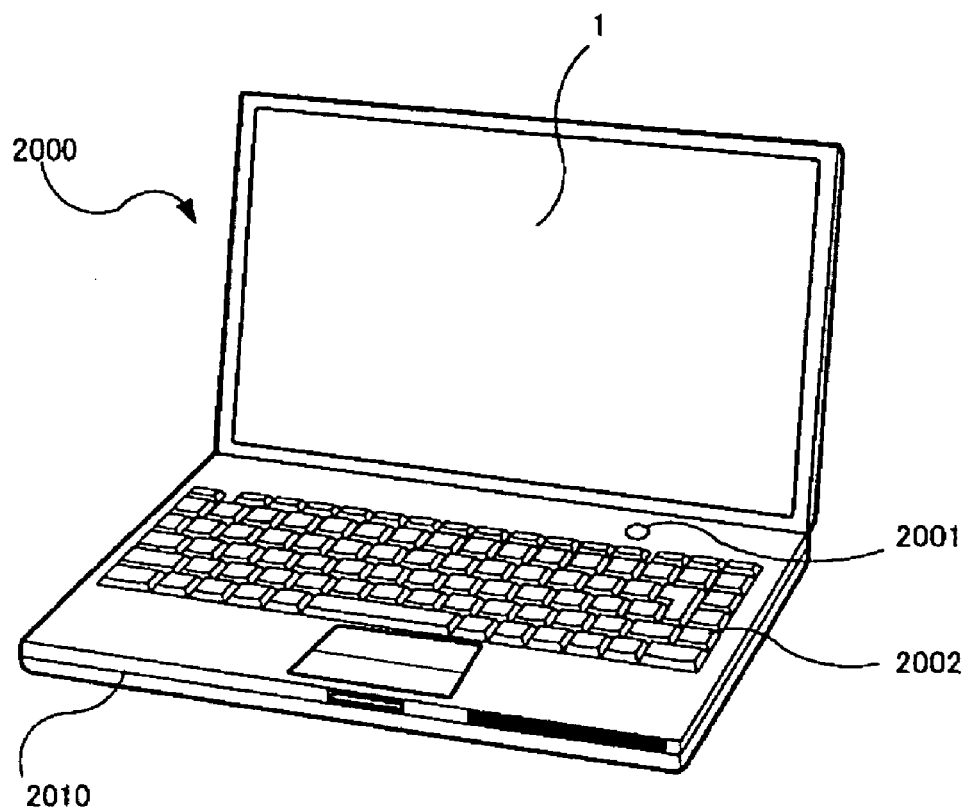
FIG. 14 is a perspective view showing a structure of a mobile personal computer equipped with the electro-optical device.

Next, electronic apparatuses to which the electro-optical device 1 according to any one of the above-mentioned first to sixth embodiments and modification is applied will be described. FIG. 14 shows the structure of a mobile personal computer provided with the electro-optical device 1. A personal computer 2000 comprises the electro-optical device 1, functioning as a display unit, and a main body 2010. The main body 2010 is provided with a power switch 2001 and a keyboard 2002. Since the electro-optical device 1 uses the OLED elements 420, it is possible to display an image with a wider viewing angle.

Figure 15:
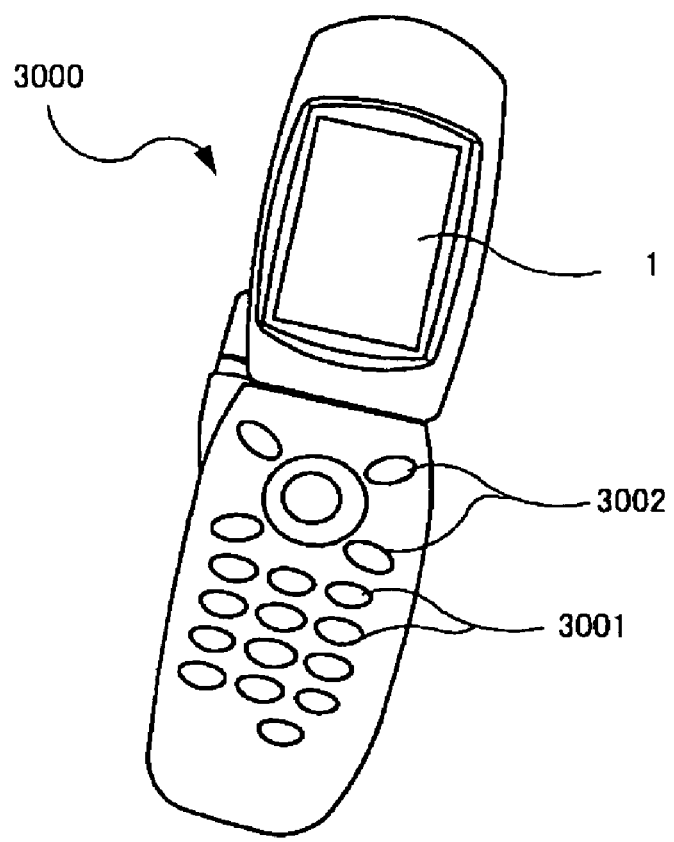
FIG. 15 is a perspective view showing a structure of a mobile phone equipped with the electro-optical device.

FIG. 15 shows the structure of a mobile phone provided with the electro-optical device 1. A mobile phone 3000 comprises a plurality of operating buttons 3001, scroll buttons 3002, and the electro-optical device 1 functioning as a display unit. The operation of the scroll button 3002 enables an image displayed on the electro-optical device 1 to be scrolled.

Figure 16:
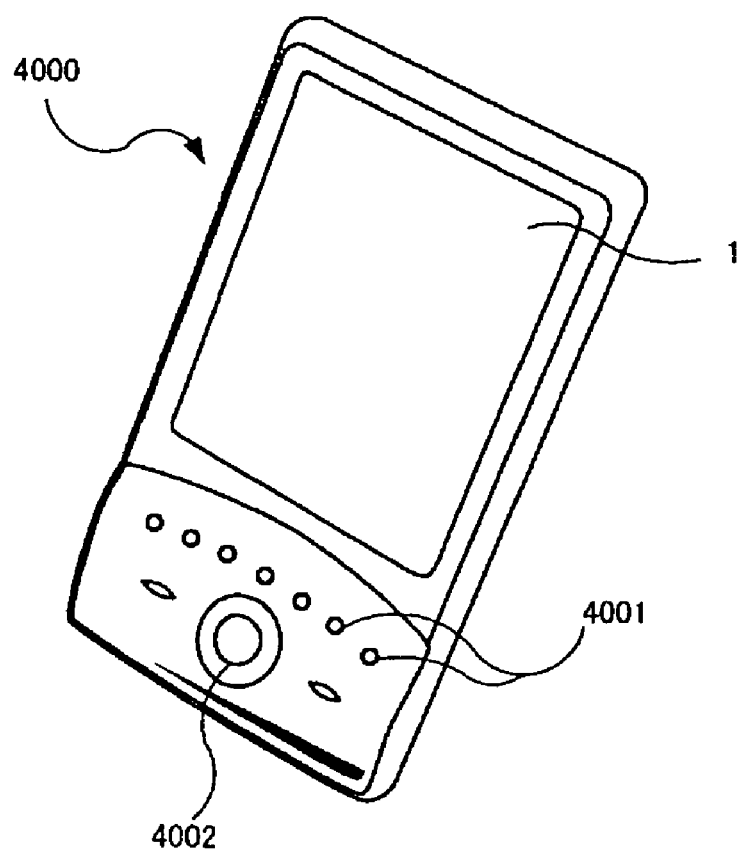
FIG. 16 is a perspective view showing a structure of a personal digital assistant equipped with the electro-optical device.
Figure 17:
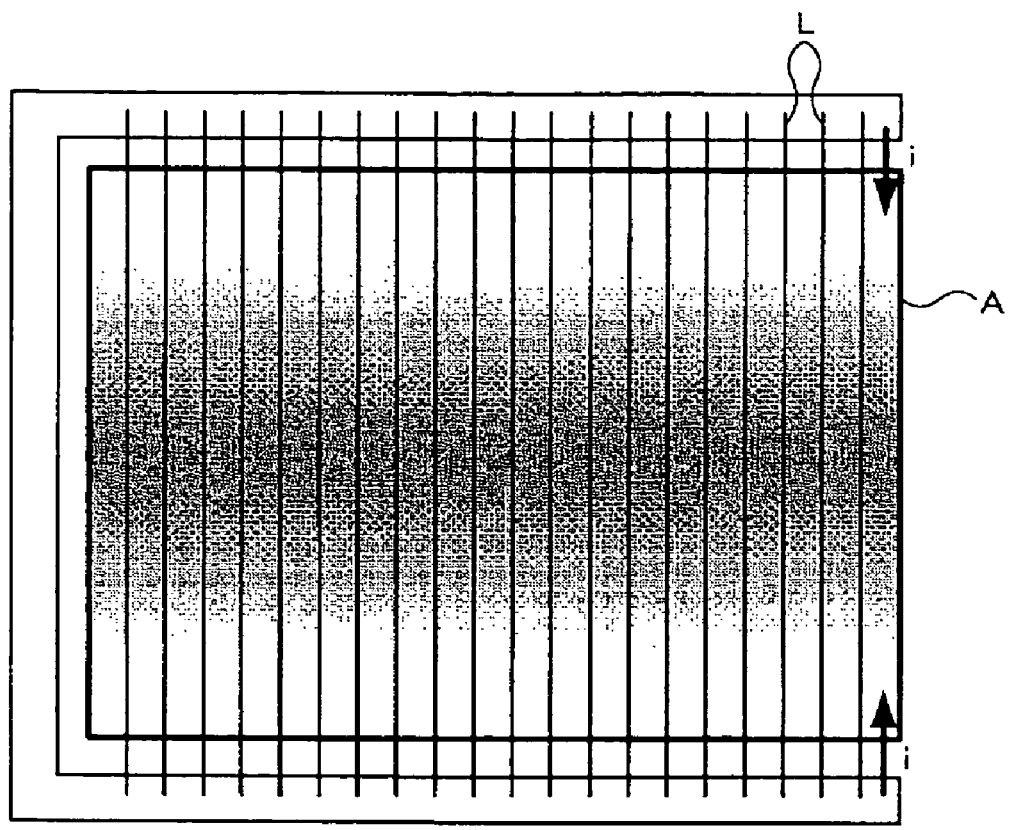
FIG. 17 is a view showing a structure of power line wiring according to a conventional art.
Figure 18:
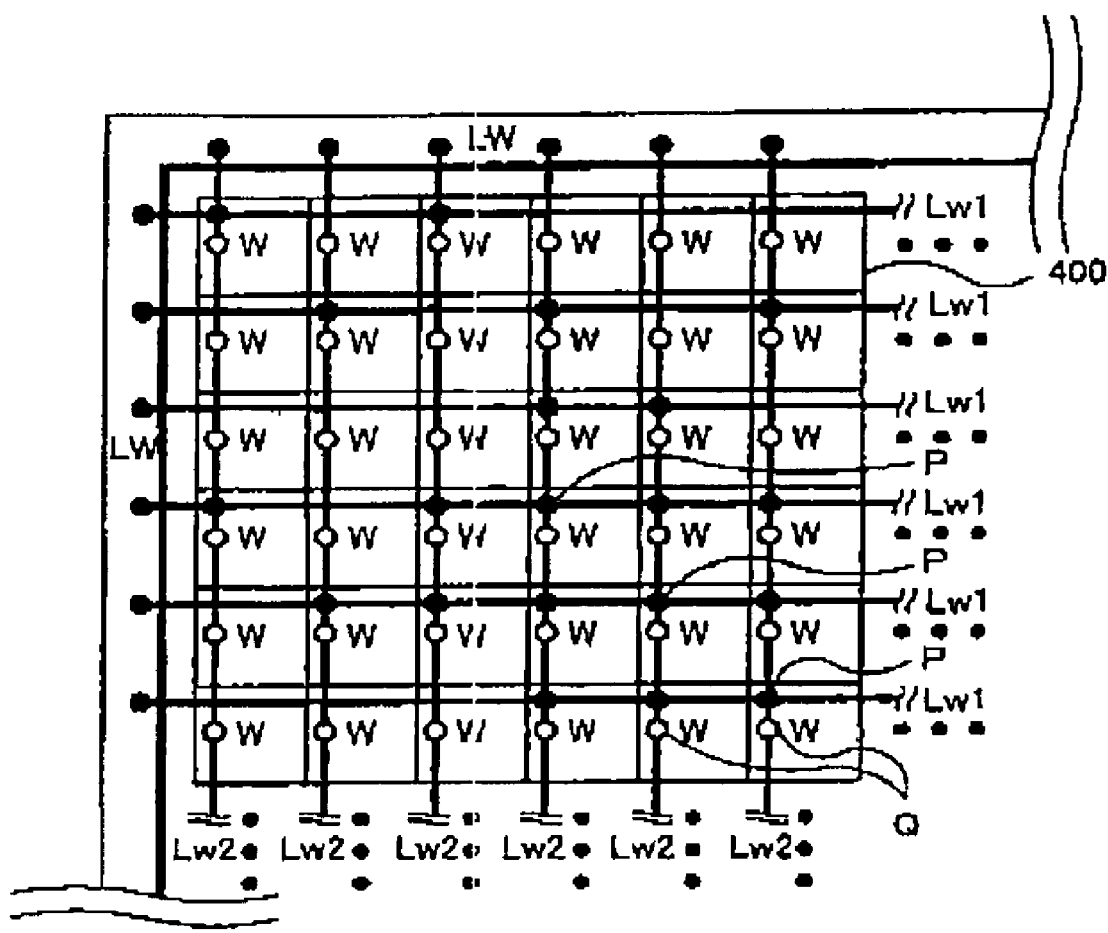
FIG. 18 is a view showing a detailed structure of power line wiring in an electro-optical device according to a modification of the third embodiment.

FIG. 16 shows the structure of a personal digital assistant (PDA) provided with the electro-optical device 1. A PDA 4000 comprises a plurality of operating buttons 4001, a power button 4002, and the electro-optical device 1 functioning as a display unit. The operation of the power button 4002 enables various information items, such as an address book and a schedule book, to be displayed on the electro-optical device 1.

Further, in addition to the electronic apparatuses illustrated in FIGS. 14 to 16, the apparatuses provided with the electro-optical device 1 according to the present invention include a digital still camera, a liquid crystal television set, a viewfinder type and monitor-direct-view type videotape recorder, a car navigation apparatus, a pager, an electronic organizer, an electronic calculator, a word processor, a work station, a television phone, a POS terminal, apparatuses equipped with a touch panel, and the like. Further, the above-mentioned electro-optical device 1 can be applied to these various electronic apparatuses as a display unit.

What is claimed is:

1. An electro-optical device comprising:
    a pixel region including a plurality of pixel circuits each having a light emitting element;
    a main power line provided in an outer circumferential portion that is external to the pixel region, the main power line including a first portion and a second portion adjacent the first portion, the first portion extending along one side of the pixel region and the second portion extending along another side of the pixel region;
    a plurality of first sub-power lines each connected to the first portion of the main power line and extending to the inside of the pixel region in a first direction;
    a plurality of second sub-power lines each connected to the second portion of the main power line and extending to the inside of the pixel region in a second direction that intersects the first direction;
    sub-power lines connecting points connecting the first sub-power lines to the second sub-power lines at some intersections therebetween; and pixel connecting points connecting the pixel circuits to at least one of the plurality of first sub-power lines or the plurality of second sub-power lines, the sub-power line connecting points being provided at the some intersections of the first sub-power lines and the second sub-power lines such that density of the sub-power line connecting points increases with increased distance from the main power line and increased proximity to the center of the pixel region.

2. The electro-optical device according to claim 1, the main power line surrounding the pixel region and both ends of each of the first sub-power lines, and the second power lines being connected to the main power lines.

3. The electro-optical device according to claim 1, further comprising:

the light emitting elements including plural kinds of elements having different emission colors, and the main power line being composed of a plurality of main power line separately formed, each corresponding to one of the emission colors of the light emitting elements; and the sub-power line connecting points being provided at at least some intersections of the first sub-power lines and the second sub-power lines that are connected to the main power line corresponding to the same emission color.

4. The electro-optical device according to claim 3, the pixel circuits being arranged in the pixel region in a row direction and a column direction, the first sub-power lines being formed substantially parallel to the row direction, and each of the first sub-power lines being divided into a plurality of wiring lines, and the divided wiring lines being connected to second sub-power lines corresponding to the same color.

5. The electro-optical device according to claim 3, the sub-power line connecting points being provided at more intersections corresponding to one emission color than at intersections corresponding to another emission color.

6. The electro-optical device according to claim 3, the pixel circuits being arranged in the pixel region in a row direction and a column direction, and the first sub-power lines being formed substantially parallel to the row direction every predetermined number of rows.

7. The electro-optical device according to claim 1, further comprising:

the light emitting elements including plural kinds of elements having different emission colors, and the main power line including a common main power line which corresponds to some of the light emitting elements having different emission colors whose voltage values are in a predetermined range at the time of white display, and a separate main power line corresponding to others of the light emitting elements whose voltage values are outside the predetermined range at the time of white display; and the sub-power line connecting points being provided at at least some intersections of the first sub-power lines and the second sub-power lines that are connected to the common main power line, and being provided at at least some intersections of the first sub-power lines and the second sub-power lines that are connected to the separate main power line.

8. The electro-optical device according to claim 1, the light emitting elements consisting of elements having the same emission color, and the sub-power line connecting points being provided at at least some intersections of the first sub-power lines and the sceond sub-power lines.

9. The electro-optical device according to claim 8, further comprising color filters or a color-converting layer corresponding to a plurality of colors regularly arranged in the pixel region.

10. The electro-optical device according to claim 1, the pixel circuits being arranged in the pixel region in a column direction, and deviating from each other by a predetermined distance in a row direction.

11. An electronic apparatus comprising the electro-optical device according to claim 1.

* * * * *